United States Patent
Nomoto et al.

(10) Patent No.: US 7,542,498 B2
(45) Date of Patent: Jun. 2, 2009

(54) SEMICONDUCTOR LASER DIODE

(75) Inventors: Etsuko Nomoto, Sagamihara (JP); Tsukuru Ohtoshi, Hanno (JP)

(73) Assignee: OpNext Japan, Inc., Kanagawa (JP)

( * ) Notice: Subject to any disclaimer, the term of this patent is extended or adjusted under 35 U.S.C. 154(b) by 41 days.

(21) Appl. No.: 11/195,792

(22) Filed: Aug. 3, 2005

(65) Prior Publication Data

US 2006/0187987 A1    Aug. 24, 2006

(30) Foreign Application Priority Data

Feb. 18, 2005    (JP)    ............................. 2005-041640

(51) Int. Cl.
*H01S 5/00*    (2006.01)
(52) U.S. Cl. ............. 372/45.01; 372/44.01; 372/45.012
(58) Field of Classification Search .............. 372/45.01, 372/44.01, 43.01, 45.012
See application file for complete search history.

(56) References Cited

U.S. PATENT DOCUMENTS

| | | | | |
|---|---|---|---|---|
| 4,961,197 | A * | 10/1990 | Tanaka et al. ............. | 372/45.01 |
| 5,383,214 | A * | 1/1995 | Kidoguchi et al. ...... | 372/46.014 |
| 5,940,422 | A * | 8/1999 | Johnson .................... | 372/45.01 |
| 6,816,531 | B1 * | 11/2004 | Rossin et al. ................. | 372/64 |
| 6,873,634 | B2 * | 3/2005 | Onomura et al. ......... | 372/45.01 |
| 6,873,635 | B2 * | 3/2005 | Yamasaki et al. ........ | 372/45.01 |

FOREIGN PATENT DOCUMENTS

| | | |
|---|---|---|
| JP | 05-243669 | 2/1992 |
| JP | 11-233883 | 2/1998 |
| JP | 11-274635 | 3/1998 |

OTHER PUBLICATIONS

Nagashima et al., "1480-NM Pump Laser with Asymmetric Quaternary Cladding Structure Achieving High Output Power of >1.2 W with Low Power Consumption," (2004) IEEE, 19th, ThA7 09:30-09:45, pp. 47-48.
Hoshi et al., "Monolithic Dual-Wavelength High Power Laser Diodes," The Institute of Electronics, Information and Communication Engineers, Technical Report of IEICE OPE2003-181, LQE2003-118 (Dec. 2003), pp. 41-44.

* cited by examiner

*Primary Examiner*—Minsun Harvey
*Assistant Examiner*—Kinam Park
(74) *Attorney, Agent, or Firm*—Reed Smith LLP; Juan Carlos A. Marquez, Esq.

(57) ABSTRACT

A semiconductor laser device that can be operated at high power and that has a structure which can suppress kink, reduce loss and stabilize the direction of polarization simultaneously, and in which an optical pattern decreases monotonously as receding from an active layer and the crystal composition can be easily controlled. A plurality of layers of high refractive index different in the composition from that of the cladding layer are introduced being dispersed over a range wider than the spot size for directing light closer to the lower cladding layer of the semiconductor laser and stabilizing the direction of polarization. The electric field intensity is decreased monotonously as receding from the active layer for the optical pattern.

18 Claims, 10 Drawing Sheets

SEMICONDUCTOR LASER DIODE

CLAIM OF PRIORITY

The present application claims priority from Japanese Application JP 2005-041640 filed on Feb. 18, 2005, the content of which is hereby incorporated by reference into this application.

TECHNICAL FIELD

The present invention relates to a semiconductor laser device. The semiconductor laser device of the invention is particularly useful when it is used as a light source for information processing terminals or optical communication, etc.

RELATED ART

Figure 5:
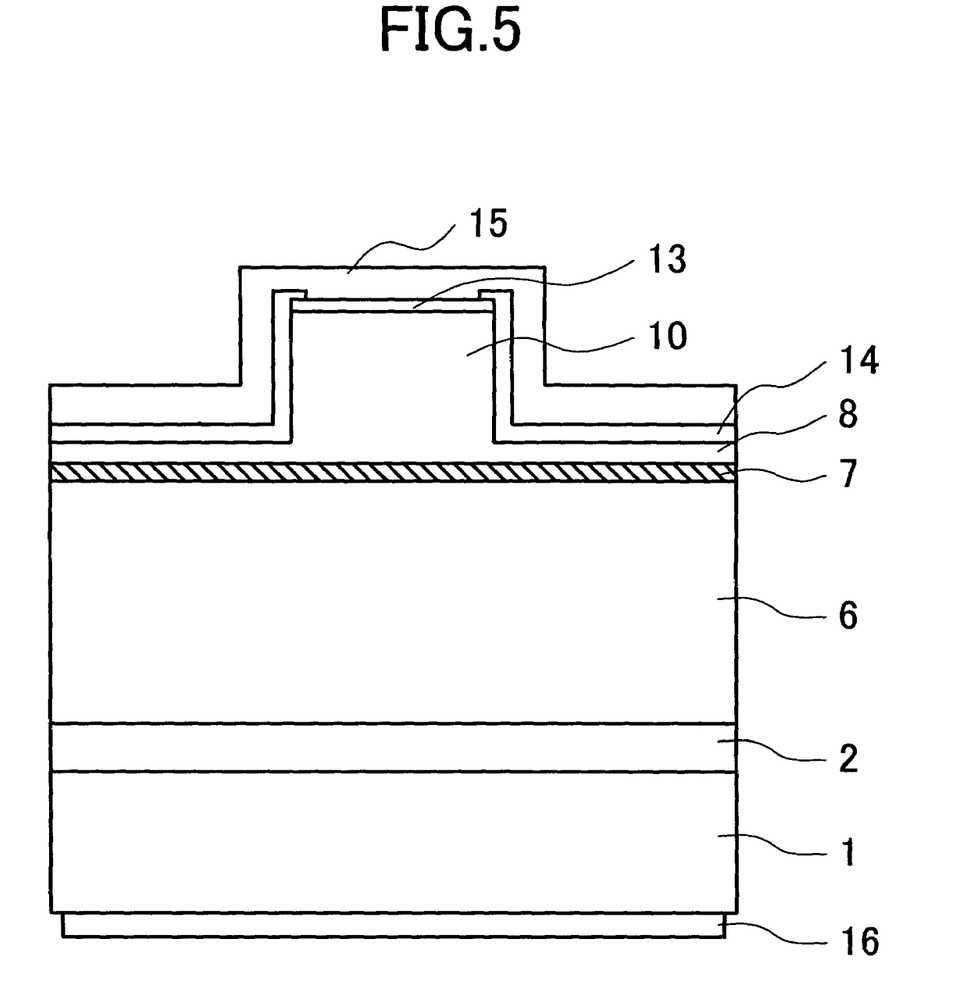
FIG. 5 is a cross-sectional view of a ridge type semiconductor laser using an asymmetric cladding layer according to the prior art.

As a structure for increasing the power of a semiconductor laser, a structure in which the refractive index or the film thickness is made asymmetric between cladding layers above and below an active layer has been known in the art. Such an example can be found, for example, in 2004 IEEE 19th International Semiconductor Laser Conference Digest, pp 47 (Non-Patent Document 1) or JP-A No. 11-233883 (Patent Document 1), for example, as shown in FIG. 5. In such a waveguide channel structure, when light is directed to a lower cladding layer 6 by making the average refractive index of the lower cladding layer 6 higher than the refractive index of the upper cladding layer 10, generation of higher mode of a horizontal lateral mode can be suppressed to increase the cut-off width. This can suppress the kink which is a phenomenon that the optical output increases non-linearly relative to an increase in current. Since the cut-off width can be made sufficiently larger than the width of the guide channel, the kink can be suppressed even when the refractive index fluctuates in the light emitting portion upon an increase of the optical output, thereby increasing the output in a stabilized single mode. Simultaneously, since the light absorption in a GaAs contact layer 13 over the upper cladding layer 10 can be decreased by directing the light to the lower cladding layer 6, the loss can be lowered. Further, the same effect can also be obtained as in JP-A No. 5-243669 (Patent Document 2) by rendering the film thickness of the optical guiding layer asymmetric and providing a layer of a high refractive index layer to the lower cladding layer.

Figure 6:
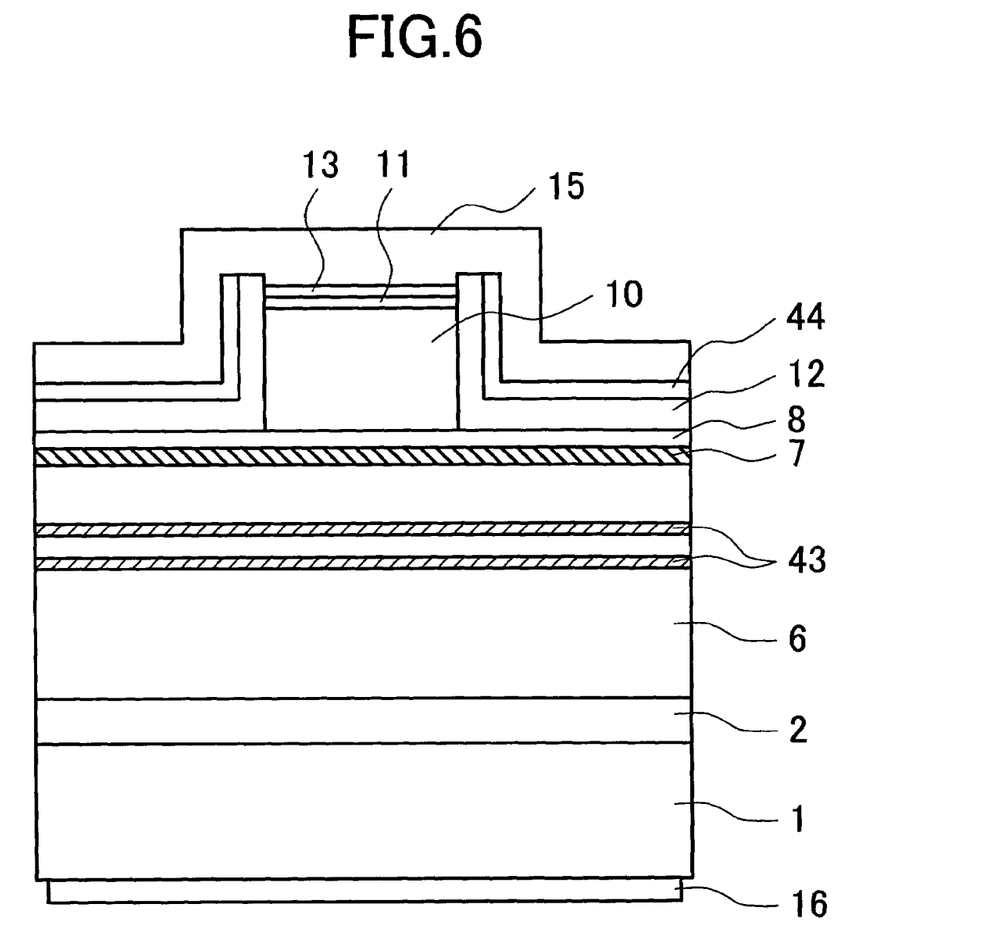
FIG. 6 is a cross-sectional view of a ridge type semiconductor laser in which an optical guiding layer is inserted to a lower cladding layer according to the prior art.

On the other hand, Electronic Information Communication Society Technical Study Report Vol. 103, No. 523 (2003) page 41) (Non-Patent Document 2) discloses introduction of two optical guiding layers 43 each comprising GaInP having negative strain in an AlGaInP n-cladding layer 6 as shown in FIG. 6 as a structure for simultaneously providing the increased output and narrowed vertical radiation angle of a light source for use in DVD recording. By changing the thickness and position of the two optical guiding layers 43, it is possible to provide a degree of freedom for the design of the light confinement coefficient in the active layer 7 having an effect on a threshold current value and an absorption loss in upper and lower GaAs layers, 13, 1, 2 having an effect on the slope efficiency. Accordingly, the vertical radiation angle can be narrowed with no trouble such as increase of the threshold carrier density.

[Patent Document 1] JP-A No. 11-233883 (FIG. 5)
[Patent Document 2] JP-A No. 5-243669
[Patent Document 3] JP-A No. 11-274635
[Non-Patent Document 1] 2004 IEEE 19th International Semiconductor Laser Conference Digest (page 47)

[Non-Patent Document 2] Electronic Information Communication Society Technical Study Report Vol. 103, No. 523 (2003) (page 41)

The present invention intends to obtain a semiconductor laser device capable of suppressing the kink, lowering the loss and stabilizing the direction of polarization, with the light distribution being continuous in order to improve the characteristics of a light source for use in DVD recording.

In the semiconductor laser device in which the refractive index of the cladding layers is made asymmetrical referred to in FIG. 5 as the prior art described above, the optical distribution is shifted toward the lower cladding layer in order to suppress the kink. In a case of a laser using an AlGaInP material used for a light source for use in DVD recording, since it has a refractive index waveguide structure with the extremely small difference of the refractive index between the cladding layer and the active layer, light confinement to the active layer decreases as the refractive index of the lower cladding layer approaches the refractive index of the active layer for suppressing kink. In addition, since the refractive index has anisotropy due to the effect of local distortion caused at the optical guide channel portion by the buried layer, insulative film, electrode, etc., the direction of polarization becomes instable and, for example, the oscillation plane of the electric field may sometimes be different from the surface of the active layer even under oscillation at a TE mode. While it is necessary that the direction of polarization is stable within the active layer surface in the DVD optical system, since it is more stable as the light confinement to the active layer increases, it is in a trade off relation with the condition for suppressing the kink. Accordingly, it is difficult to control the composition for satisfying them simultaneously and the process margin in the manufacture is decreased. Further, it is difficult to detect the difference of composition between the lower cladding layer and the upper cladding layer in the inspection step. For example, in $(Al_xGa_{1-x})_{0.5}In_{0.5}P$ often used as the cladding layer of the optical source for use in DVD recording, since the Al composition x is about 0.6 to 0.7 and the energy level at $\Gamma$ point of a conduction material is extremely close to the energy level at X point, carriers may possibly be dispersed, and the intensity of the photoluminescence capable of coping only with the direct transition of the $\Gamma$ point is extremely small. In addition, in a case where x is different by 0.01, since the difference of the peak wavelength of the photoluminescence between the two layers is about 1.2 nm and it is substantially equal to the measuring error for photoluminescence, it is difficult to detect the difference.

Figure 7A:
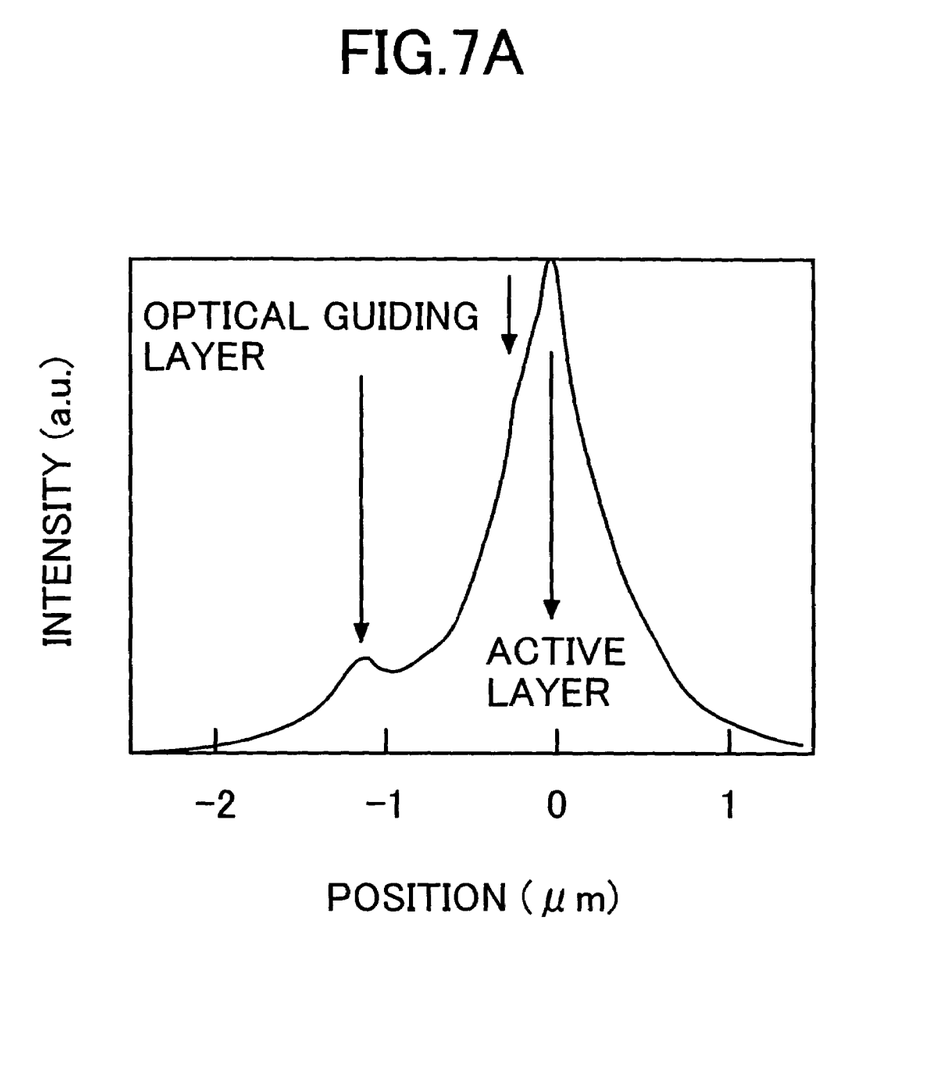
FIG. 7A shows a near field pattern in a semiconductor laser in which an optical guiding layer is inserted to a lower cladding layer.
Figure 7B:
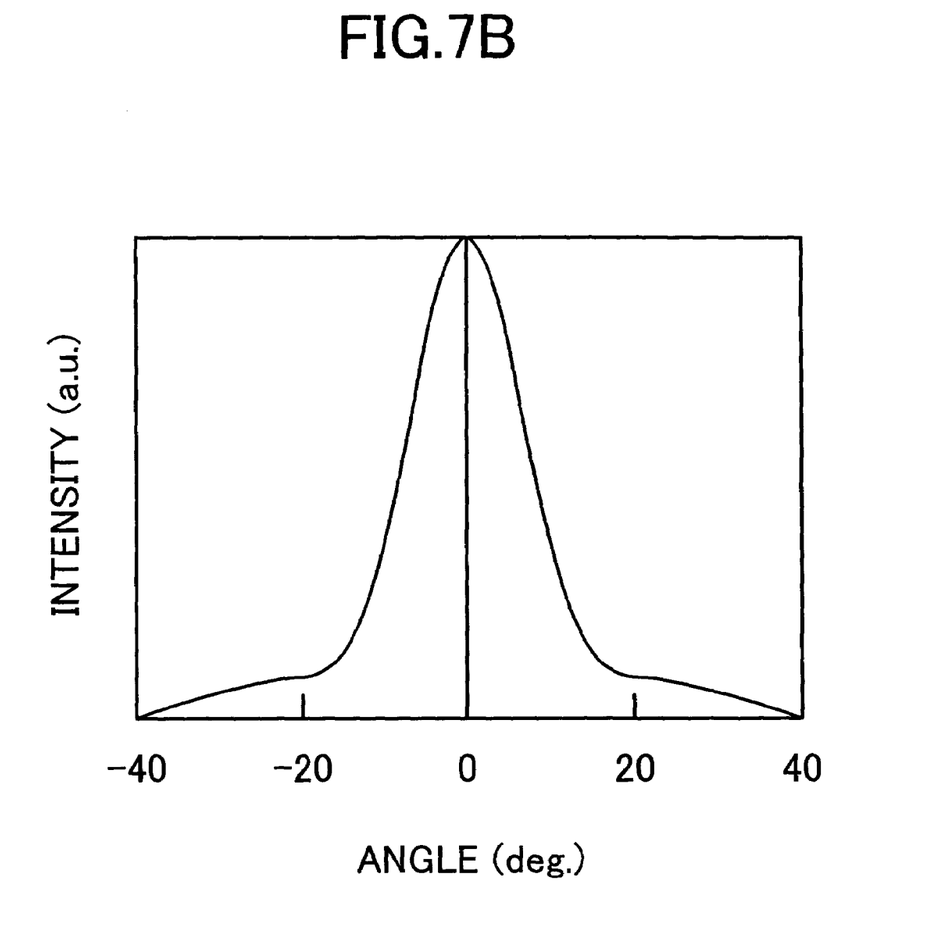
FIG. 7B shows a far field pattern in a semiconductor laser in which an optical guiding layer is inserted to a lower cladding layer.
Figure 8A:
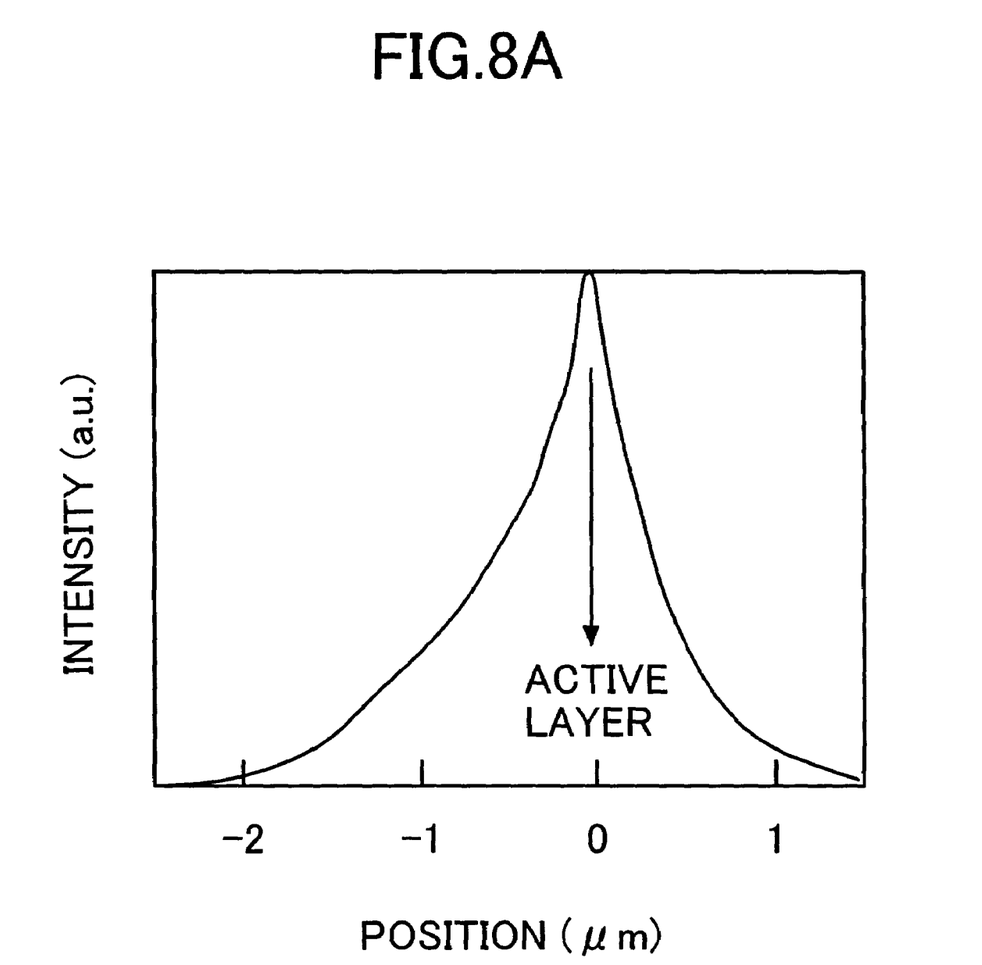
FIG. 8A shows a near field pattern in a semiconductor laser according to a invention.
Figure 8B:
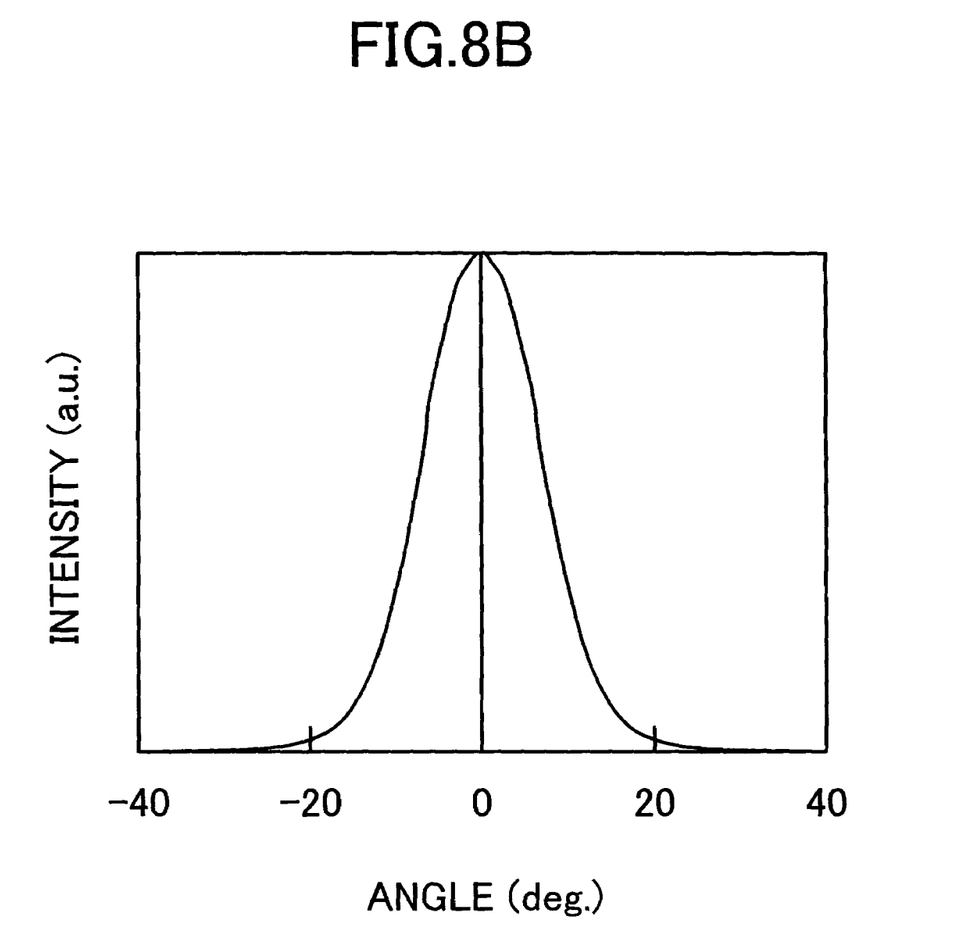
FIG. 8B shows a far field pattern in a semiconductor laser according to a invention.

In a semiconductor laser device adopting two optical guiding layers in an AlGaInP n-cladding layer as shown in FIG. 6 as a second example of the prior art, there is a likelihood for the design of the structure capable of simultaneously satisfying the suppression of the kink and the stabilization of the polarization direction which are in the trade off relation. However, when it is designed to introduce 1 to 4 optical guiding layers in accordance with the standards of the light source for use in DVD recording, optical confinement of the optical guiding layer is large tending to localize the electric field intensity. FIGS. 7A and 7B show an example of calculating the shape of the light distribution. FIG. 7A shows a near field pattern in which the ordinates expresses the optical intensity and the abscissa expresses the position in the direction of the crystal stacking with the active layer as the center assuming the direction to the upper cladding layer as positive. FIG. 7B is a far field pattern in which the ordinate expresses the optical intensity and the abscissa expresses the far field beam divergent angle. It can be seen that plural peaks are present in the near field images of FIG. 7A, and undesired effect such as skirting is given also on the shape of the far field images shown in FIG. 7B. In a case where plural optical spots are present, a large error may possibly be caused when signals are read and written by introducing laser light on DVD media. In view of the spots on the DVD media, it is desirable for continuous optical pattern not having extremal values at the positions other than the active layer position as shown in FIGS. 8A and 8B.

With the situations as described above, the invention intends to provide a semiconductor laser device enabling high power operation, having a structure capable of simultaneously suppressing the kink, reducing the loss, stabilizing the direction of polarization, and allowing the optical pattern to decrease monotonously with receding from the active layer, and enabling easy control of the crystal composition for the structure.

DESCRIPTION OF THE INVENTION

In the present invention, layers of high refractive index different from the cladding layer in view of the composition are introduced while being dispersed for a range larger than the spot size, in order to direct light to a lower cladding layer nearer to a crystal growing substrate of a semiconductor laser. To stabilize the direction of polarization, at least one of the introduced layers lies in the region where the electric field intensity is about 50% or more of the maximum value. The introduced layers are dispersed for a wide range larger than the spot size at a distance sufficiently larger than the interlayer distance referred to as a super lattice and less than ¼ of the spot size (that is, radius) in the vertical direction. The spot size represents a distance from the maximal point of the emission intensity to a point at which the intensity is $1/e^2$ adopted in the relevant technical field. Symbol e is the base of natural logarithm.

In the invention, the distance between each of the layers is preferably made larger such that the states of electrons or holes do not overlap. Accordingly, this is different from the thickness in the case of a super lattice or multi-quantum well. In a case where the introduced layer is the super lattice or multi-quantum well, confinement of carriers or light increases by the overlap of the state of electrons or holes. Therefore, since the optical density has a maximal value at the position, this hinders that the optical power in the near field changes continuously. Accordingly, the distance between the introduced layers is made large enough so that confinement of carriers or light does not increase excessively. However, in a case where the distance between the introduced layers is excessively large, the effect of preventing the refractive index anisotropy in the active layer is decreased. Accordingly, in the effective embodiment of the invention, the distance is decided such that the layers are introduced by at least four layers within the range of the spot size while the introduced layers receding as much as possible. To make the optical output in the near field continuous, it is preferable to be less than ¼ of the spot size in the vertical direction in view of the setting of conditions that it is necessary to introduce at least four introduced layers dispersingly.

Further, by making the refractive index and film thickness of the introduced layer smaller than the refractive index or film thickness of the active layer, it provides an effect of preventing the fact that the optical confinement of the introduced layer is made larger than the active layer and the change of the optical power in the near field is not continuous. It is also possible to make both of the refractive index and film thickness of the introduced layer smaller than those of the active layer. In the invention, it is not always necessary to space all the plural layers at an equal distance. In this regard, this is different from the structure in which semiconductor super lattice periodical thin film layer is disposed below the active layer as disclosed in JP-A No. 11-274635 (Patent Document 3).

In another aspect, the semiconductor laser device of the invention is as described below. That is, this can be said as a semiconductor laser device of a structure in which a cladding layer put between a semiconductor substrate and an active layer has a first cladding layer, a second cladding layer and a stacked body inserted between the first and the second cladding layer, and the stacked body having a layer having a refractive index higher than the refractive index of the first or the second cladding layers and comprising a material different from that of the first or the second cladding layer with a thickness of about electron de Broghie wavelength or less, and a layer having a refractive index substantially equal with that of the first or the second cladding layer stacked alternately is inserted with the total thickness of the first and the second cladding layers or more.

In the embodiment, it can be controlled most easily in view of the manufacture to determine one of the layers of the stacked body similar in composition to the first and the second cladding layers. Actually, since the composition may possibly differ slightly depending on the crystal growing condition or the amount of doping even for the same design, the refractive index may sometimes differ by about 0.001. To further increase the degree of freedom in the design, a combination of the first and the second cladding layers having refractive indexes different from each other by about 0.008 at maximum may also be adopted. In this case, assuming that the composition for each of one of the layers of the stacked body to be insert has a value between the refractive indexes of the first and the second cladding layer, it is estimated as about 0.004 (to 0.15%) in view of the difference of the refractive index. In the specification, "substantially the same refractive index" is considered to be within such an extent of range.

In the manufacture of the semiconductor laser device according to the invention, it is preferred to minimize the kinds of the compositions of crystals constituting the layered structure of the semiconductor laser device in order to improve the controllability for the composition and facilitate the detection in the inspection step. Control is easiest in a structure where the refractive index is made equal between the upper cladding layer and the lower cladding layer excluding the introduced layer, the introduced layer has a lattice constant substantially equal to the cladding layer and has a film thickness smaller than that of the active layer and a refractive index smaller than that of the active layer. The relationship between the thickness and refractive index of the introduced layer and those of the active layer is determined such that the optical confinement is largest in the active layer and the optical pattern is made continuous. That is, it is determined such that the electric field intensity distribution takes a maximum value at the position on the active layer, not takes a maximal value at the position on the introduced layer, and decreases monotonously as receding from the active layer. For this purpose, it is desirable that plural introduced layers are incorporated over a range larger than the spot size in the vertical direction. The insertion position for the introduced layer may be decided as four or less position so as to satisfy a far field angle from 15° to 19° at the operating temperature suitable to a light source for use in DVD. In this case, the possibility that the electric field may take a maximal value at the introduction position is increased. Consequently, it is preferred to decrease the electric field intensity in each of the layers by increasing the number of introduced layers, and the positions for introduction are spaced apart and the number of the positions is increased to five or more. For example, in a case where the near field and far field patterns are calculated assuming that introduced layers are incorporated at 10 positions, it is shown as in FIGS. 8A and 8B. In a semiconductor laser of a ridge structure or buried ridge structure, if the refractive index of the etch stopper layer for manufacturing a ridge structure is higher than the refractive index of the cladding layer, control can be conducted easily by making the refractive index of the introduced layer equal to that of the etch stopper layer. For example, in a case where the cladding layer-comprises AlGaInP and the etch stopper layer is a super lattice comprising GaInP and AlGaInP, the composition can be controlled easily when the introduced layer comprises GaInP. Even when it is designed such that the electric field intensity does not take a maximal point, appropriate optical confinement and fixing of the electric field direction to the horizontal direction occur and the direction of polarization can be stabilized in a horizontal state.

The invention can provide a semiconductor laser device capable of suppressing the kink in the output characteristics and satisfying stabilization for the direction of polarization. Further, the invention enables the optical distribution to obtain continuous characteristics.

PREFERRED EMBODIMENTS OF THE INVENTION

Prior to detailed descriptions of preferred embodiments of the present invention, combinations of semiconductor material systems suitable to the invention will be described. The materials to be described below are usable in any of the structures of the invention.

(1) A semiconductor laser device in which the cladding layer in direct concern with the invention is either InP or $In_{1-x}Ga_xAs_yP_{1-y}$, and a layer comprising the material different from the cladding layer comprises $In_{1-z-w}Ga_zAl_wAs$ ($0 \leq z \leq 0.47$ and $0 \leq w \leq 0.48$), or $In_{1-x'}Ga_{x'}As_{y'}P_{1-y'}$ ($0 < x < x' \leq 0.47$ and $0 < y < y' \leq 1$) different, in view of the composition, from $In_{1-x}Ga_xAs_yP_{1-y}$.

(2) A semiconductor laser device in which the cladding layer in direct concern with the invention is either InP or $In_{1-z-w}Ga_zAl_wAs$, and layer comprising the material different from the cladding layer comprises $In_{1-x}Ga_xAs_yP_{1-y}$ ($0 \leq x \leq 0.47$ and $0 \leq y \leq 1$), or $In_{1-z'-w'}Ga_{z'}Al_{w'}As$ ($0 \leq z < z' \leq 0.47$ and $0 \leq w' < w \leq 0.4$) different in view of the composition from $In_{1-z-w}Ga_zAl_wAs$.

The semiconductor laser devices (1) and (2) above are semiconductor laser devices each having an oscillation wavelength of 1.3 μm to 1.55 μm band. They are usually used for optical communication. In a case where any one of the compositions of the layers basically contained as the layered structure of the laser is used for the composition of the insertion layer, the control is easy. For example, this is the same composition as that for the etch stopper layer in the ridge structure or a layer of high reflective index used as the diffraction grating of a distribution feedback laser.

(3) A semiconductor laser device in which the cladding layer in direct concern with the invention comprises $Al_xGa_{1-x}As$ ($0 < x \leq 1$), and the layer comprising the material different from the cladding layer comprises GaAs.

(4) A semiconductor laser device in which the cladding layer in direct concern with the invention comprises $Ga_{0.52}In_{0.48}P$, and the layer comprising the material different from the cladding layer comprises $Al_xGa_{1-x}As$ ($0 \leq x < 0.4$).

(3) and (4) are a device with an oscillation wavelength of 0.9 μm to 1.05 μm or a device with an oscillation wavelength of from 780 to 870 nm. The former is used, for example, as a fiber amplifier for optical communication and the latter is used as an industrial or medical laser. In a case where any one of the compositions of the layers basically contained as the layered structure of the laser is used for the composition of the insertion layer, the control is easy. For example, this is the same composition as that of the etch stopper layer of the ridge structure.

(5) A semiconductor laser device in which the cladding layer in direct concern with the invention comprises $Al_xGa_yIn_{1-x-y}P$ ($0 \leq x \leq 0.53$ and $0 \leq y \leq 0.52$) and the layer comprising the material different from the cladding layer comprises either $Ga_{0.52}In_{0.48}P$ or $Al_zGa_{1-z}As$ ($0 \leq z \leq 1$).

The semiconductor laser device of the material system described above is a device with an oscillation wavelength for excitation of from 630 to 690 nm used as an industrial or medical laser. In a case where any composition of the layer basically contained as the layered structure of the laser is used for the composition of the insertion layer, the control is easy. For example, this is the same composition as that for the etch stopper layer of the ridged structure.

(6) A semiconductor laser device in which the cladding layer in direct concern with the invention comprises $Al_xGa_{1-x}N$ and the layer comprising the material different from the cladding layer comprises $Al_{x'}Ga_{1-x'}N$ ($0 \leq x' < x \leq 1$).

The semiconductor laser device of the material system is a device with an oscillation wavelength for excitation of from 280 to 410 nm used as industrial or medical laser. In a case where any composition of the layer basically contained as the layered structure of the laser is used for the composition of the insertion layer, the control is easy.

Then, preferred embodiments will be described below.

Embodiment 1

Figure 1:
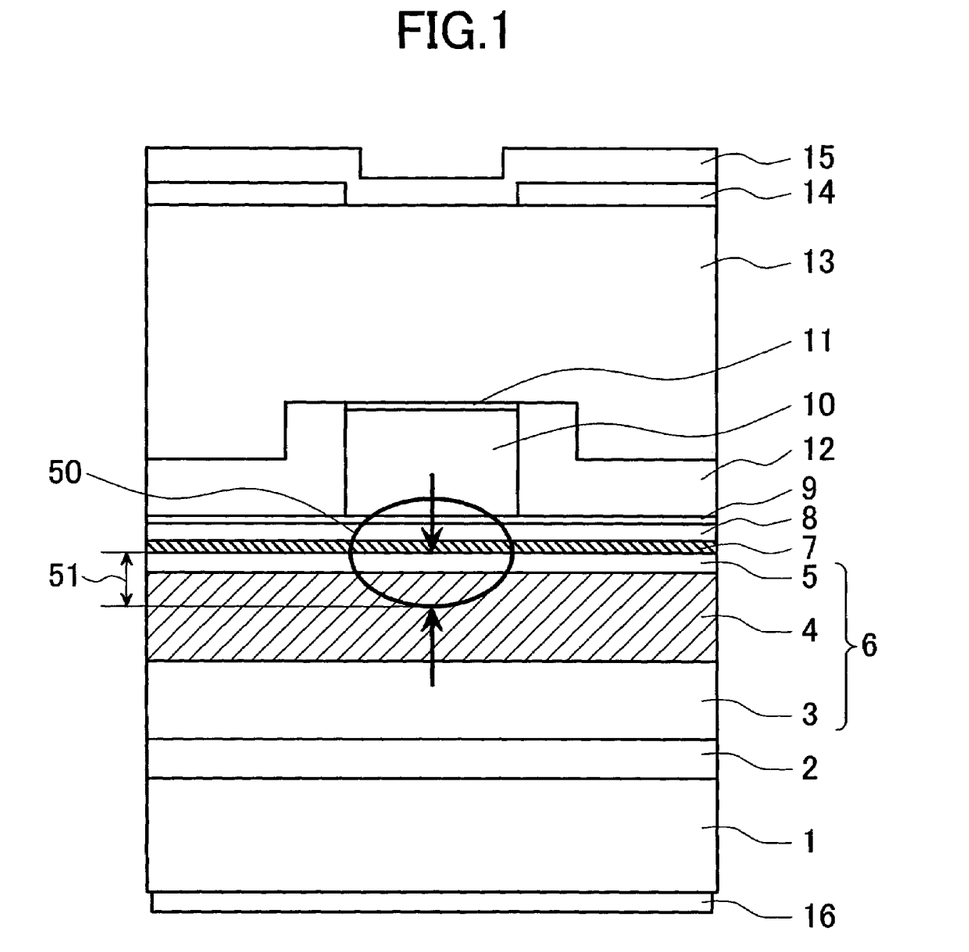
FIG. 1 is a cross-sectional view of an AlGaInP system buried ridge type semiconductor laser according to a first embodiment of the present invention.

FIG. 1 is a cross-sectional view showing a structure of a semiconductor laser according to a first embodiment of the present invention. The cross section corresponds to a plane crossing the proceeding direction of light. Above an n-GaAs substrate tilted at 10 degrees from a (100) plane direction, an n-GaAs buffer layer 2 of 0.5 μm thick, an n-cladding layer 6 as a first cladding layer, a multi-quantum well structure active layer 7, a p-AlGaInP cladding layer 8 of 0.2 μm thick, a p-GaInP etch stopper layer 9 of 5 nm thick, a p-AlGaInP cladding layer 10 of 1.3 μm thick, and a p-GaInP contact layer 11 of 0.05 μm thick are epitaxially grown successively by a metal organic vapor phase epitaxy method.

The n-cladding layer 6 comprises specifically an n-AlGaInP layer 3 of 1 μm thick, a portion 4 having a periodical structure comprising ten n-GaInP layers each of 3 nm thick and nine n-AlGaInP layers each of 120 nm thick, and an-AlGaInP layer 5 of 0.2 μm thick. As the main material for the n-cladding layer 6, the n-AlGaInP layer is used and a plurality of thin layers of n-GaInP layers different in the composition from AlGaInP is inserted in the n-cladding layer 6 in view of the structure. GaInP has a higher refractive index than AlGaInP. Further, the oscillation wavelength is set at 650 nm to 660 nm.

The multi-quantum well structure active layer 7 comprises three unintentionally-doped compressive strained GaInP quantum well layers each of 5 nm thick, four tensile strained AlGaInP quantum barrier layers each of 4 nm thick, and non-strained AlGaInP optical separate confinement layer of 20 nm thick above and below them. Further, the compositions of AlGaInP contained in the cladding layers 3, 4, 5, 8, and 10 are the same, i.e., $(Al_{0.7}Ga_{0.3})_{0.5}In_{0.5}P$. Making the composition constituting each of the layers the same can improve controllability for the composition in the manufacturing step.

Then, after formation of a desired diffusion mask by using a photolithographic step, a ZnO solid diffusion source is vapor deposited. Then, by applying an annealing treatment at a temperature from 500° C. to 600° C., a Zn impurity diffusion region is formed at regions corresponding to the cavity facets. After formation of the impurity diffusion region, the diffusion source is removed. Then, a ridge stripe structure is formed by a usual method. By way of the photolithographic step and the etching step, the layer 10 and the layer 11 are removed by etching till the layer 9, to form a stripe.

Then, an n-AlInP current blocking layer 12 of 1.0 μm thick is put to selective area growth by an MOVPE method. Then, after burring with a p-GaAs contact layer 13 of 3 μm thick by the MOVPE method, trenches for reducing the device capacitance are formed on both sides of the stripe by the photolithographic step and the etching step (not illustrated). Then, an insulative film mask 14 is formed, a p-side electrode 15 and an n-side electrode 16 are vapor deposited and then devices are cut out by cleaving scribe. The device oscillates at a wavelength of 650 nm to 660 nm, the kink free maximum optical power of 300 mW was attained at a temperature of 80° C. and the variation in the polarization direction was stabilized within ±3 degrees.

In FIG. 1, reference numeral 50 denotes a light emission spot of the laser device. Reference numeral 51 denotes a spot size in the vertical direction of the spot. In this example, the spot size in the vertical direction of the laser is 0.88 μm. The distance between each of the thin n-GaInP layers inserted in the n-cladding layer 6 is defined by the thickness 120 nm of the n-AlGaInP layer. Accordingly, the thickness is 120 nm. The value 120 nm is less than 220 nm, i.e., ¼ of 0.88 μm of the spot size in the vertical direction of the laser.

Further, in Embodiment 1, it can be recognized that, in the n-GaInP layers of 3 nm thick inserted in the n-cladding layer, the layer most remote from the active layer is at a position below 1.307 μm (=0.2+0.123×9) below the active layer, and extends over a range larger than the spot size. In this case, the near field pattern monotonously decreases as receding from the active layer as show in FIG. 8A to be described later.

Embodiment 2

Figure 2:
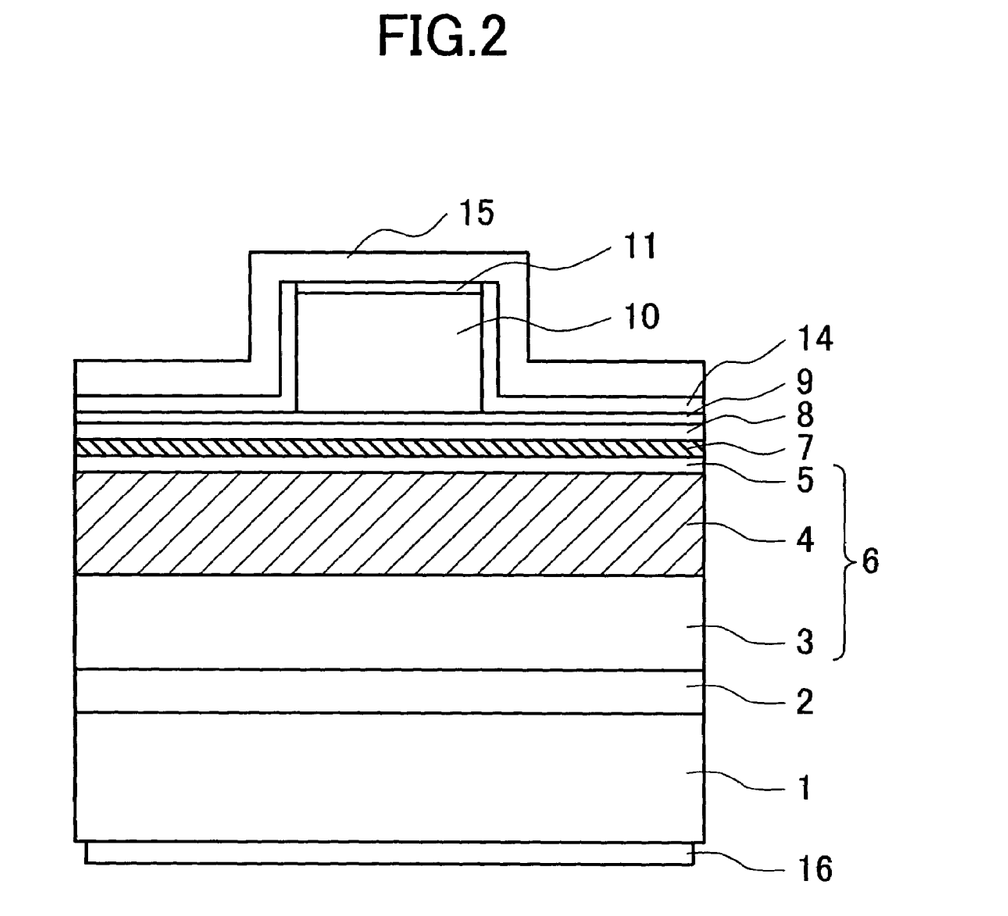
FIG. 2 is a cross-sectional view of an AlGaInP system ridge type semiconductor laser according to a second embodiment of the present invention.

FIG. 2 is a cross-sectional view showing the structure of a semiconductor laser according to a second embodiment of the invention. While this embodiment is different in the structure concerning the optical confinement, the semiconductor stacked structure regarding the semiconductor laser is the same as that in Example 1 described above.

The cross sectional view of FIG. 2 corresponds to a plane crossing the proceeding direction of light. Above an n-GaAs substrate 1 tilted at 10 degrees from a (100) plane direction, a n-type GaAs buffer layer 2 of 0.5 μm thick, an n-cladding layer 6, a multi-quantum well structure active layer 7, a p-AlGaInP cladding layer 8 of 0.2 μm thick, a GaInP etch stopper layer 9 of 5 nm thick, a p-AlGaInP cladding layer 10 of 1.3 μm thick, and a p-GaInP contact layer 11 of 0.05 μm thick are successively grown epitaxially by the MOVPE method. The n-type cladding layer 6 comprises an n-AlGaInP layer 3 of 1.5 μm thick, a portion 4 having a periodical structure of eight n-GaInP layers each of 2 nm thick and seven n-AlGaInP layers each of 100 nm thick, and an n-AlGaInP layer 5 of 0.2 μm thick.

In this embodiment, the spot size is 0.91 μm. The distance between each of the thin n-GaInP layers inserted in the n-cladding layer 6 is defined by the thickness of the n-AlGaInP layer. Accordingly, the thickness is 100 nm. The value 100 nm is less than 227.5 nm, i.e., ¼ of 0.91 μm of the spot size in the vertical direction of the laser.

Further, it can be seen that the layer most remote from the active layer in the n-GaInP layers of 2 nm thick inserted in the n-cladding layer is at a position 0.914 μm (=0.2+0.102×7) below the active layer, and extends over a range larger than the spot size. In this case, the near field pattern decreases monotonously as receding from the active layer as shown in FIG. 8A to be described later.

The multi-quantum well structure active layer 7 comprises three unintentionally-doped compressive strained GaInP quantum well layers each of 5 nm thick, four tensile strained AlGaInP quantum barrier layers each of 4 nm thick, and non-strained AlGaInP optical separation confinement layer of 10 nm thick above and below them. Further, the compositions of AlGaInP contained in the cladding layers 3, 4, 5, 8, and 10 are the same, i.e., $(Al_{0.7}Ga_{0.3})_{0.5}In_{0.5}P$. Making such a composition constituting each of the layers the same can improve controllability for the composition in the manufacturing step.

Then, after formation of a desired diffusion mask by using a photolithographic step, a ZnO solid diffusion source is vapor deposited. Then, by applying an annealing treatment at a temperature of 500° C. to 600° C., a Zn impurity diffusion region is formed at a region corresponding to the cavity facets. After formation of the impurity diffusion region, the diffusion source is removed. Then, a ridge stripe structure is formed by a usual method. By way of the photolithographic step and the etching step, the layer 10 and the layer 11 are removed by etching to the layer 9, to form a stripe.

Then, trenches for reducing the device capacitance are formed on both sides of the stripe by the photolithographic step and the etching step (not illustrated). Then, an insulative film mask 14 is formed, a p-side electrode 15 and an n-side electrode 16 are vapor deposited and then devices are cut out by cleaving scribe. The device oscillates at a wavelength of 650 nm to 660 nm, the kink free maximum optical output of 300 mW was attained at a temperature of 80° C. and the variation in the polarization direction was stabilized within ±2 degrees.

Embodiment 3

Figure 3:
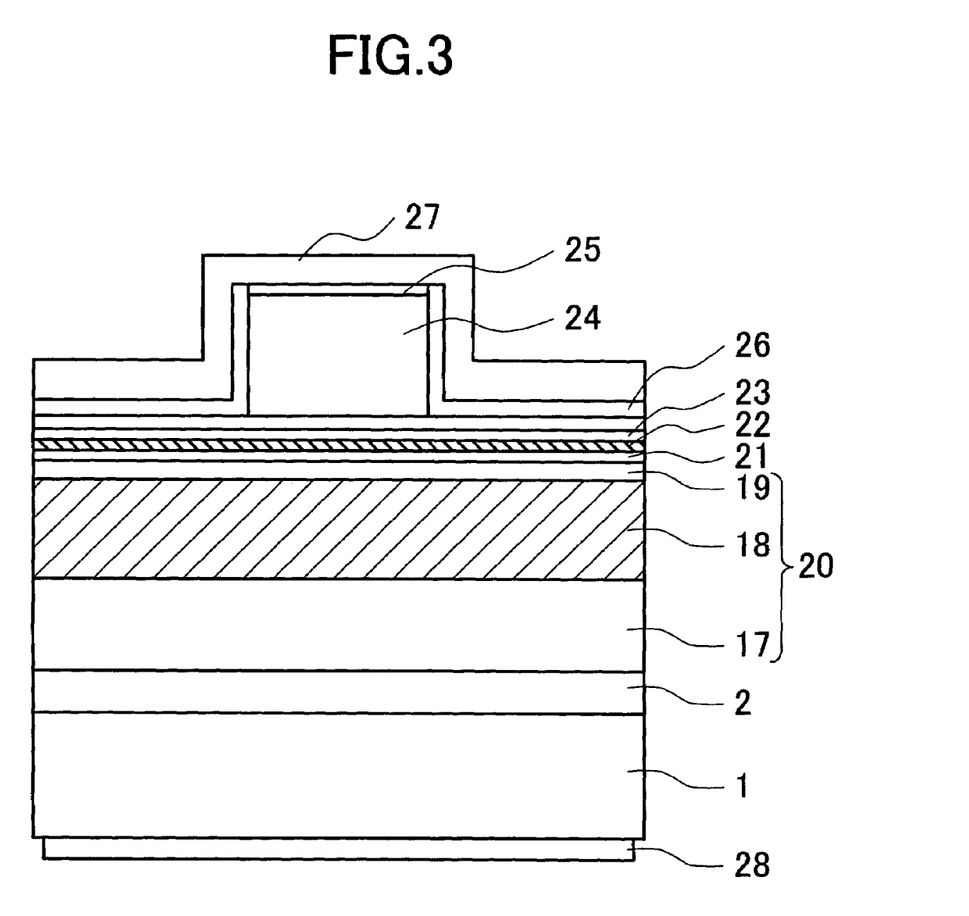
FIG. 3 is a cross-sectional view of an AlGaAs/InGaAs system ridge type semiconductor laser according to a third embodiment of the present invention.

FIG. 3 is a cross-sectional view showing the structure of a semiconductor laser according to a third embodiment of the invention. In this embodiment, the materials are changed but the stacked structure of the semiconductor is the same as those described above.

The cross-sectional view of FIG. 3 corresponds to a plane crossing the proceeding direction of light. On an n-GaAs substrate 1, an n-GaAs buffer layer 2 of 0.5 µm thick, an n-cladding layer 20 comprising an n-AlGaAs layer 17 of 1 µm thick, a portion 18 having a periodical structure of ten n-GaAs layers each of 7 nm thick and nine n-AlGaAs layers each of 100 m thick and an n-AlGaAs layer 19 of 0.2 µm thick, an n-GaAs optical separate confinement layer 21 of 30 nm thick, unintentionally-doped compressive strained $In_{0.16}Ga_{0.84}As$ quantum well active layer 22 of 10 nm thick, an n-GaAs optical separation confinement layer 23 of 30 nm thick, a p-AlGaAs cladding layer 24 of 1.5 µm thick, and a p-GaAs contact layer 25 of 0.05 µm are successively grown epitaxially by an MOVPE method. The n-cladding layer 20 has an n-AlGaAs layer 17 of 1 µm thick, a portion 18 having a periodical structure of ten n-GaAs layers 10 each of 7 nm thick and nine n-AlGaAs layers each of 100 nm thick, and an n-AlGaAs layer 19 of 0.2 µm thick.

Further, the composition for AlGaAs contained in each of the cladding layers 17, 18, 19, and 24 is the same, i.e., $Al_{0.3}Ga_{0.7}As$. Making the composition constituting each of the layers the same can improve the controllability for the composition in the manufacturing step.

Then, the layer 24 is removed by etching to the midway by way of a photolithographic step and an etching step to form a stripe. Then, an insulative film 26 is formed, a p-side electrode 27 and an n-side electrode 28 are vapor deposited and devices are cut out by cleaving scribe. The device oscillates at a wavelength of 980 nm to 1080 nm, a maximum king free optical output of 800 mW is attained at a temperature of 80° C., and the variations in the direction of polarization were stabilized within ±2 degrees.

In this embodiment, the vertical spot size is 1.1 µm. The distance between each of the thin layers n-GaAs layers inserted in the n-cladding layer 20 is defined by the thickness of the n-AlGaAs layer. The thickness the n-AlGaAs layer is 100 nm. The value is less than 275 nm, i.e., ¼ of 1.1 µm of the vertical spot size. Further, it can be seen that the layer most remote from the active layer in the n-GaAs layers of 7 nm thick inserted in the n-cladding layer is at a position 1.163 µm below (=0.2+0.107×9) below the active layer, and extends over a range larger than the spot size. In this case, the near field pattern decreases monotonously as receding from the active layer as show in FIG. 8A.

Embodiment 4

Figure 4:
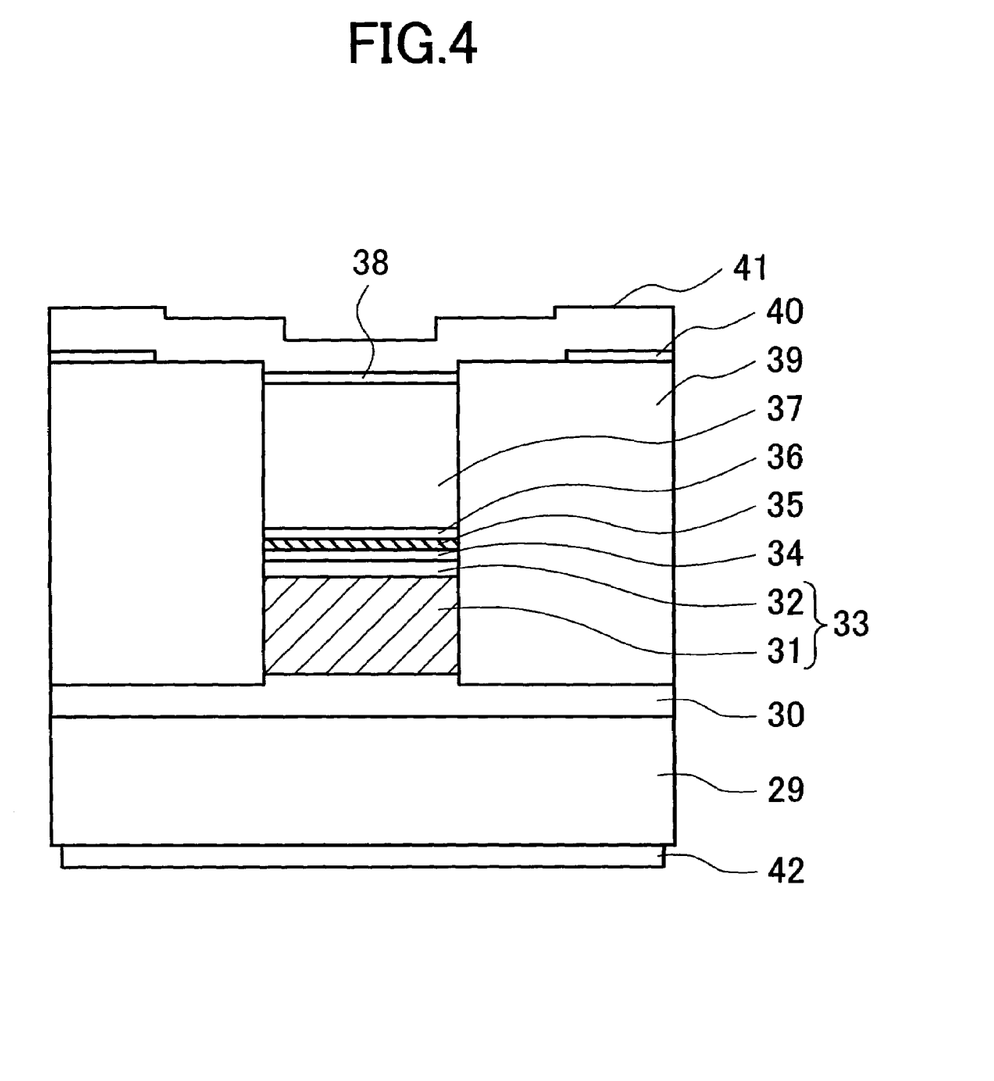
FIG. 4 is a cross-sectional view of an InGaAsP system buried hetero type semiconductor laser according to a fourth embodiment of the present invention.

FIG. 4 is a cross-sectional view showing the structure of a semiconductor laser according to a fourth embodiment of the invention. The cross-section corresponds to a plane crossing the proceeding direction of a light. On an n-InP substrate 29, an n-InP buffer layer 30 of 0.5 µm thick, an n-cladding layer 33, an InGaAsP optical separate confinement layer 34 of 100 nm thick, a unintentionally-doped strain compensated InGaAsP quantum well active layer 35 of 50 nm thick in total, an InGaAsP optical separation confinement layer 36 of 100 nm thick, a p-InP cladding layer 37 of 1.5 µm thick, and a p-InGaAs contact layer 38 of 0.05 µm thick are epitaxially grown successively by an MOVPE method.

The n-cladding layer 33 in this embodiment comprises a portion 31 having a structure formed by alternately stacking six n-InGaAsP layers with the thickness increasing as 5, 6, 7, 8, 9, and 10 nm toward the active layer and five n-InP layers each of 200 nm thick, and an n-InP layer 32 of 0.2 µm thick.

In this embodiment, a first conduction type cladding layer is configured such that the change of the optical output in the near field of the semiconductor laser device is made continuous. The near field is substantially equal to that in FIG. 8A. That is, the change of the optical output of the near field is continuous. The spot size is 1.8 µm and the thickness of an insertion region 31 is 1.6 µm.

In this embodiment, the same material as that for the cladding layer (=buffer layer 30) is used for the substrate.

For the sake of easy manufacture, the wavelength for the composition of InGaAsP in the stacked structure 31 is made the same as that of the barrier layer constituting the quantum well of the active laser 35.

The layer 30 is removed by etching to the midway by way of a photolithographic step and an etching step to form a stripe. Then, a semi-insulative InP current blocking layer 39 is selectively grown by an MOVPE method to bury the stripe. Then, an insulative film 40 is formed, a p-side electrode 41 and an n-side electrode 42 are vapor deposited and devises are cut out by cleaving scribe. The device oscillates at a wavelength of 1400 nm to 1480 nm, a maximum kink free optical output reaches 1 W at a temperature of 25° C., and the variations in the direction of polarization was stabilized within ±2 degrees.

Embodiment 5

Then, a fifth embodiment is to be described. The basic structure is the same as that of the first embodiment described above and is different in that the structure of the n-cladding layer is constituted as described below.

The cladding layer comprises a n-AlGaInP layer 3 of 0.46 µm thick, a portion 4 having a periodical structure comprising ten n-GaInP layers each of 3 nm thick and nine n-AlGaInP layers each of 180 nm thick, and an n-AlGaInP layer 5 of 0.2 µm thick. Further, the total thickness of the n-AlGaInP layer 3, the stacked portion 4 of the semiconductor layers and the n-AlGaInP layer 5 is made the same as that of the n-cladding layer 6 in Embodiment 1. That is, a stacked body 4 of 1.65 µm thick formed by alternately stacking ten n-GaInP layers each of 3 nm thick and nine n-AlGaInP layers each of 180 nm thick is inserted between the n-AlGaInP layer 3 of 0.46 µm thick as the first cladding layer and the n-AlGaInP layer 5 of 0.2 µm thick as the second cladding layer. The stacked body 4 has a larger thickness than the total thickness, 0.66 µm, of the first and the second cladding layers. In this case, the vertical spot size in the vertical direction is 0.88 µm.

Principal embodiments of the present invention are to be described below.

(1) A semiconductor laser device comprising a first conduction type semiconductor substrate, a first conduction type cladding layer formed over the substrate, an active layer formed over the cladding layer, and a second conduction type cladding layer formed over the active layer, in which in view of the oscillation wavelength of the semiconductor laser device, a plurality of layers each having a refractive index higher than the refractive index of the first conduction type cladding layer and comprising a material different from the first conduction type cladding layer are inserted in the first conduction type cladding layer at a distance of less than ¼ of the vertical spot size over a range larger than the vertical spot size.

(2) A semiconductor laser device comprising a first conduction type semiconductor substrate, a first conduction type cladding layer formed over the substrate, an active layer formed over the cladding layer, and a second conduction type cladding layer formed over the active layer, in which in view of the oscillation wavelength of the semiconductor laser device, a plurality of layers each having a refractive index higher than the refractive index of the first conduction type cladding layer and comprising a material different from the first conduction type cladding layer are inserted in the first conduction cladding layer over a range larger than the vertical spot size, and the inter-layer distance is arranged such that the optical pattern decreases monotonously as receding from the active layer.

(3) A semiconductor laser device according to item 1 or 2 above, wherein the average refractive index of the first conduction type cladding layer including a layer comprising a material different from that of the cladding layer is higher than the average refractive index of the second conduction type cladding layer.

(4) A semiconductor laser device according to item 3, wherein the average refractive index is substantially equal between the first conduction type cladding layer not including the layer comprising the material different from that of the cladding layer and the second conduction type cladding layer.

(5) A semiconductor laser device according to any one of items 1 to 4, wherein the refractive index of the layer comprising the material different from that of the cladding layer is lower than the refractive index of the layer having the highest refractive index constituting the active layer.

(6) A semiconductor laser device according to any one of items 1 to 4, wherein the film thickness of the layer comprising the material different from that of the cladding layer is not greater than the film thickness of the layer having the highest refractive index constituting the active layer.

(7) A semiconductor laser device according to any one of items 1 to 6, wherein the second conduction type cladding layer has a ridged shape and comprises a second conduction type lower cladding layer and a second conduction type upper cladding layer in the form of the ridged shape over the active layer, in which an etch stopper layer used for fabricating the second conduction type upper cladding layer into the ridged shape is disposed just above the second conduction type lower cladding layer.

(8) A semiconductor laser device according to 7, wherein the refractive index of the layer comprising the material different from that of the cladding layer is substantially equal to the refractive index of the layer having the highest refractive index constituting the etch stopper layer.

(9) A semiconductor laser device according to 7, wherein the film thickness of the layer comprising the material different from that of the cladding layer is substantially equal to the film thickness of the layer having the highest refractive index constituting the etch stopper layer.

(10) A semiconductor laser device in which a structure formed by alternately stacking a layer having a refractive index higher than that of the first and the second cladding layers, and a thickness of about several tens of atomic layers and comprising a material different from that of the first and the second cladding layer, and a layer having a refractive index substantially equal to that of the first or the second cladding layer is inserted between the first and second cladding layers which are put between the semiconductor substrate and the active layer, with the thickness of the structure being larger than the total thickness of the first and the second cladding layer.

(11) A semiconductor laser device according to item 10, wherein the number of layers comprising the material different from that of the cladding layer is 4 or more.

(12) A semiconductor laser device according to any one of items 1 to 11, wherein the cladding layer comprises either InP or $In_{1-x}Ga_xAs_yP_{1-y}$ and the layer comprising the material different from that of the cladding layer comprises $In_{1-z-w}Ga_zAl_wAs$ ($0 \leq z \leq =0.47$ and $0 \leq w \leq 0.48$) or $In_{1-x'}Ga_{x'}As_{y'}P_{1-y'}$ ($0<x<x' \leq 0.47$ and $0<y<y' \leq 1$) different in the composition from $In_{1-x}Ga_xAs_yP_{1-y}$.

(13) A semiconductor laser device according to any one of items 1 to 11, wherein the cladding layer comprises either InP or $In_{1-z-w}Ga_zAl_wAs$ and the layer comprising the material different from that of the cladding layer comprises $In_{1-x}Ga_xAs_yP_{1-y}$ ($0 \leq x \leq 0.47$ and $0 \leq y \leq 1$) or $In_{1-z'-w'}Ga_{z'}Al_{w'}As$ ($0 \leq z < z' \leq 0.47$ and $0 \leq w' < w \leq 0.48$) different in the composition from $In_{1-z-w}Ga_zAl_wAs$.

(14) A semiconductor laser device according to any one of items 1 to 11, wherein the cladding layer comprises $Al_xGa_{1-x}As$ ($0 < x \leq 1$), and the layer comprising the material different from the cladding layer comprises GaAs.

(15) A semiconductor laser device according to any one of items 1 to 11, wherein the cladding layer comprises $Ga_{0.52}In_{0.48}P$, and the layer comprising the material different from that of the cladding layer comprises $Al_xGa_{1-x}As$ ($0 \leq x < 0.4$).

(16) A semiconductor laser device according to any one of items 1 to 11, wherein the cladding layer comprises $Al_xGa_yIn_{1-x-y}P$ ($0 \leq x \leq 0.53$ and $0 \leq y \leq 0.52$) and the layer comprising the material different from that of the cladding layer comprises either $Ga_{0.52}In_{0.48}P$, or $Al_zGa_{1-z}As$ ($0 \leq z \leq 1$).

(17) A semiconductor laser device according to any one of items 1 to 11, wherein the average composition of the cladding layer comprises $Al_xGa_{1-x}N$ and the layer comprising the material different from that of the cladding layer comprises $Al_{x'}Ga_{1-x'}N$ ($0 \leq x' < x \leq 1$).

According to the invention, a plurality of layers each of high refractive index different in the composition from the cladding layer are introduced and dispersed over a range wider than the spot size, to direct light closer to the lower cladding layer, thereby making it possible to enlarge the cut off range and reduce optical absorption in the contact layer above the upper cladding layer. At the same time, with the effect of fixing the electric field direction by the introduced layers of high refractive index, the direction of polarization can be stabilized. Further, likelihood of the design can be improved by utilizing the composition that is detectable during inspection in the semiconductor laser manufacturing process. Accordingly, a structure in which the optical pattern decreases monotonously as receding from the active layer can be selected and a single peak optical spot necessary for reading an optical disk can be obtained.

The reference numerals will be briefly explained below:

1 . . . n-GaAs substrate, 2 . . . n-GaAs buffer layer, 3 . . . n-AlGaInP layer 3, 4 . . . portion having a periodical structure of ten n-GaInP layers and nine n-AlGaInP layers, 5 . . . n-AlGaInP layer, 6 . . . n-cladding layer, 7 . . . multi-quantum well structure active layer, 8 . . . p-AlGaInP cladding layer, 9 . . . p-GaInP etch stopper layer, 10 . . . p-AlGaInP cladding layer, 11 . . . p-GaInP contact layer, 12 . . . n-AlInP current blocking layer, 13 . . . p-GaAs contact layer, 14 . . . insulative film mask, 15 . . . p-side electrode, 16 . . . n-side electrode, 17 . . . n-AlGaAs layer, 18 . . . a portion having a periodical structure of ten n-GaAs layers and nine n-AlGaAs layers, 19 . . . n-AlGaAs layer, 20 . . . n-cladding layer, 21 . . . GaAs optical separation confinement layer, 22 . . . unintentionally-doped compressive strained InGaAs quantum well active layer, 23 . . . GaAs optical separation confinement layer, 24 . . . p-AlGaAs cladding layer, 25 . . . p-GaAs contact layer, 26 . . . insulative film, 27 . . . p-side electrode, 28 . . . n-side electrode, 29 . . . n-InP substrate, 30 . . . n-InP buffer layer, 31 . . . portion having a structure formed by alternately stacking six n-InGaAsP layers and five n-InP layers, 32 . . . n-InP layer, 33 . . . n-cladding layer, 34 . . . InGaAsP optical separation confinement layer, 35 . . . unintentionally-doped compressive strained InGaAsP quantum well active layer, 36 . . . InGaAsP optical separation confinement layer, 37 . . . p-InP cladding layer, 38 . . . p-InGaAs contact layer, 39 . . . semi-insulative InP current blocking layer, 40 . . . insulative film, 41 . . . p-side electrode, 42 . . . n-side electrode, 43 . . . optical guiding layer, 44 . . . GaAs cap layer, 50 . . . light emission spot, 51 . . . spot size in the vertical direction of the light emission spot.

What is claimed is:

1. A semiconductor laser device comprising:
   a first conduction type semiconductor substrate;
   a first conduction type cladding layer formed over the substrate;
   an active layer formed over the first conduction type cladding layer; and
   a second conduction type cladding layer formed over the active layer,
   wherein, in view of an oscillation wavelength of the semiconductor laser device, at least four layers each of which comprises a material different from the first conduction type cladding layer are inserted in the first conduction type cladding layer, and a distance between adjacent layers inserted in the first conductive type cladding layers is less than ¼ of a vertical spot size over a range larger than the vertical spot size,
   wherein a layer nearest to the active layer among the layers comprising a material different from the first conductive type cladding layer is in a range of the spot size in a vertical direction, and
   wherein each of the at least four layers has a refractive index higher than a refractive index of the first conductor type cladding layer and located within the range of the spot size.

2. A semiconductor laser device according to claim 1, wherein the distance is arranged such that change in a near field optical output of the semiconductor laser device is continuous.

3. A semiconductor laser device according to claim 1, wherein, in view of the oscillation wavelength of the semiconductor laser device, the at least four layers each of which has a refractive index higher than the refractive index of the first conduction type cladding layer and comprises the material different from the first conduction type cladding layer are inserted in the first conduction type cladding layer over a range larger than a spot size in the direction vertical to the semiconductor substrate and the distance between each of the layers is arranged such that the optical pattern decreases monotonously as receding from the active layer.

4. A semiconductor laser device according to claim 1, wherein an average refractive index of the first conduction type clad layer including the at least four layers comprising the material different from that of the cladding layer is higher than an average refractive index of the second conduction type clad layer.

5. A semiconductor laser device according to claim 2, wherein an average refractive index of first conduction type clad layer including the at least four layers comprising the material different from that of the cladding layer is higher than an average refractive index of the second conduction type cladding layer.

6. A semiconductor laser device according claim 1, wherein an average refractive index of the first conduction type cladding layer is substantially equal to that of the second conduction type clad layer.

7. A semiconductor laser device according claim 2, wherein an average refractive index of the first conduction type cladding layer is substantially equal to that of the second conduction type clad layer.

8. A semiconductor laser device according to claim 1, wherein a refractive index of each of the at least four layers comprising the material different from that of the cladding layer is lower than a refractive index of the active layer having the highest refractive index among the layers constituting the semiconductor laser device.

9. A semiconductor laser device according to claim 2, wherein a refractive index of each of the at least four layers comprising the material different from that of the cladding layer is lower than a refractive index of the active layer having the highest refractive index among the layers constituting the semiconductor laser device.

10. A semiconductor laser device according to claim 1, wherein a film thickness of each of the at least four layers comprising the material different from that of the first conduction type cladding layer is thinner than a film thickness of the active layer having a highest refractive index among the layers constituting the semiconductor laser device.

11. A semiconductor laser device according to claim 2, wherein the film thickness of each of the at least four layers comprising the material different from that of the cladding layer is thinner than the film thickness of the active layer having a highest refractive index among the layers constituting the semiconductor laser device.

12. A semiconductor laser device according to claim 1, wherein the second conduction type cladding layer has a ridged shape and comprises a second conduction type lower cladding layer and a second conduction type upper cladding layer in the form of the ridged shape over the active layer, and an etch stopper layer used for fabricating the second conduction type upper cladding layer into the ridged shape is disposed just above the second conduction type lower cladding layer.

13. A semiconductor laser device according claim 12, wherein the refractive index of the each of the at least four layers comprising the material different from that of the cladding layer is substantially equal to the refractive index of the layer having the highest refractive index constituting the etch stopper layer.

14. A semiconductor laser device according to claim 12, wherein the film thickness of the each of the at least four layers comprising the material different from that of the cladding layer is substantially equal to the film thickness of the layer having the highest refractive index constituting the etch stopper layer.

15. A semiconductor laser device:
   wherein a cladding layer put between a semiconductor substrate and an active layer includes a first cladding layer, a second cladding layer and a stacked body inserted between the first and the second cladding layers; and wherein the stacked body comprises at least one layer having a refractive index higher than that of the first or the second cladding layer, comprising a material different from that of the first or the second cladding layer and having a thickness of about de Broglie wavelength of an electron or less, and at least one layer having a refractive index substantially equal to that of the first or the second cladding layer, the at least one layer having a refractive index higher than that of the first or the second cladding layer and the at least one layer having a refractive index substantially equal to that of the first or the second cladding layer are stacked alternately, and the stacked body has a thickness greater than a total thickness of the first and the second cladding layers, wherein at least four layers each of which comprises a material different from the first conductive type cladding layer are inserted in the first conductive type cladding layer at a distance between adjacent layers inserted in the first conductive type cladding layers of less than ¼ of a vertical spot size over a range larger than the vertical spot size, wherein the distance is larger than the thickness of a super lattice or multi-quantum wall, wherein each of said at least four layers has a refractive index higher than a refractive index of the first conductor type cladding layer and located within the range of the spot size, and wherein the position of the layer nearest the active layer among the layers comprising a material different from the first conductive type cladding layer is within the range of the spot size in the vertical direction and the position of the layer most far from the active layer is beyond the range of the spot size in the vertical direction.

16. A semiconductor laser device according to claim 15, wherein a number of the at least one layers comprising the material different from that of the first or the second cladding layer is 5 or more.

17. A semiconductor laser device according to claim 1, wherein the plurality of layers is formed below at least a part of the first conduction type cladding layer.

18. A semiconductor laser device according to claim 15, wherein a thickness of the at least one layer having a refractive index substantially equal to the refractive index of the first or the second cladding layer is lager than the thickness of the at least one layer having a refractive index higher than the refractive index of the first or the second cladding layer.

* * * * *